US012604703B2

(12) United States Patent
Tian et al.

(10) Patent No.: US 12,604,703 B2
(45) Date of Patent: Apr. 14, 2026

(54) WAFER CHUCK WITH THERMAL TUNING CAVITY FEATURES

(71) Applicant: Lam Research Corporation, Fremont, CA (US)

(72) Inventors: Siyuan Tian, Newark, CA (US); Yuma Ohkura, San Mateo, CA (US)

(73) Assignee: Lam Research Corporation, Fremont, CA (US)

( * ) Notice: Subject to any disclaimer, the term of this patent is extended or adjusted under 35 U.S.C. 154(b) by 816 days.

(21) Appl. No.: 17/759,505

(22) PCT Filed: Jan. 28, 2021

(86) PCT No.: PCT/US2021/015429
§ 371 (c)(1),
(2) Date: Jul. 26, 2022

(87) PCT Pub. No.: WO2021/154949
PCT Pub. Date: Aug. 5, 2021

(65) Prior Publication Data
US 2023/0079804 A1      Mar. 16, 2023

Related U.S. Application Data

(60) Provisional application No. 62/967,185, filed on Jan. 29, 2020.

(51) Int. Cl.
*H01L 21/683* (2006.01)
*H01L 21/67* (2006.01)
(52) U.S. Cl.
CPC .... *H01L 21/6833* (2013.01); *H01L 21/67103* (2013.01); *H01L 21/67109* (2013.01); *H01L 21/67248* (2013.01)

(58) Field of Classification Search
USPC .................. 118/728, 725, 666, 667, 500, 58
See application file for complete search history.

(56) References Cited

U.S. PATENT DOCUMENTS 3,645,326  A      2/1972   Hochschorner et al.
5,824,605  A     10/1998   Chen et al.
(Continued)

FOREIGN PATENT DOCUMENTS

CN          102456564  A      5/2012
CN          103578900  A      2/2014
(Continued)

OTHER PUBLICATIONS

English Translation KR-20190101036-A (Year: 2019).*
(Continued)

*Primary Examiner* — Yewebdar T Tadesse
(74) *Attorney, Agent, or Firm* — Weaver Austin Villeneuve & Sampson LLP

(57) ABSTRACT

Wafer chucks or baseplates therefor are disclosed that feature thermal tuning cavity features that are positioned and sized so as to provide a more uniform temperature distribution across a wafer support surface of such a wafer chuck. Each thermal tuning cavity feature may be positioned adjacent to a portion or portions of a heat exchange passage or passages within a baseplate of the wafer chuck. By locating thermal tuning cavity features in locations underneath where the wafer support surface of the wafer chuck would otherwise demonstrate localized regions of lower temperature (as compared with adjacent regions of the wafer chuck support surface), the lower-temperature regions may be caused to have elevated temperatures that more closely match the surrounding temperatures, thereby increasing temperature uniformity.

22 Claims, 5 Drawing Sheets

(56)                    References Cited

U.S. PATENT DOCUMENTS

| | | | |
|---|---|---|---|
| 9,659,803 B2 | 5/2017 | Lubomirsky et al. | |
| 9,885,493 B2 | 2/2018 | Sriraman et al. | |
| 2003/0164226 A1 | 9/2003 | Kanno et al. | |
| 2004/0187787 A1 | 9/2004 | Dawson et al. | |
| 2007/0214631 A1 | 9/2007 | Landrigan | |
| 2007/0235134 A1 * | 10/2007 | Iimuro | H01L 21/68714 |
| | | | 700/121 |
| 2011/0073039 A1 * | 3/2011 | Colvin | C23C 16/46 |
| | | | 219/490 |
| 2019/0148118 A1 | 5/2019 | Zhang et al. | |

FOREIGN PATENT DOCUMENTS

| | | | |
|---|---|---|---|
| CN | 104302084 A | | 1/2015 |
| JP | 2003243492 A | | 8/2003 |
| JP | 2007067036 A | | 3/2007 |
| JP | 2007088411 A | | 4/2007 |
| JP | 2008509553 A | | 3/2008 |
| JP | 2014150104 A | | 8/2014 |
| JP | 2016207979 A | | 12/2016 |
| JP | 2018523913 A | | 8/2018 |
| KR | 20090011193 A | | 2/2009 |
| KR | 20190101036 A | * | 8/2019 |
| TW | 201933473 A | | 8/2019 |
| WO | WO-2014014646 A1 | | 1/2014 |

OTHER PUBLICATIONS

International Preliminary Report on Patentability dated Aug. 11, 2022 in PCT Application No. PCT/US2021/015429.
International Search Report and Written Opinion dated May 21, 2021 in PCT Application No. PCT/US2021/015429.
JP Office Action dated May 7, 2025 in JP Application No. 2022-545971, with English Translation.
JP Office Action dated Nov. 5, 2024 in JP Application No. 2022-545971, with English Translation.
KR Office Action dated Feb. 12, 2025 in KR Application No. 10-2022-7029688, with English Translation.
JP Decision to Grant and Search Report dated Sep. 24, 2025 in JP Application No. 2022-545971, with English translation.

* cited by examiner

Temperature variation
from reference
temperature
(dimensionless)

Max temperature
variation is ~23% of
upper example

Max temperature
variation is ~19% of
uppermost example

WAFER CHUCK WITH THERMAL TUNING CAVITY FEATURES

RELATED APPLICATIONS

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools frequently use a chuck, which is a device that supports, and frequently clamps in place, a semiconductor wafer during processing operations. Such wafer clamping functionality may be provided, for example, using vacuum clamping, in which gas is evacuated from the region between the semiconductor wafer and the surface of the chuck on which it rests so that there is a greater pressure on the top side of the semiconductor wafer than the bottom side, or electrostatic clamping, in which an electrostatic charge is created on the chuck so as to cause the semiconductor wafer to be attracted to the chuck by electrostatic force.

Other features commonly found in chucks include, for example, heaters and/or cooling systems. For example, some chucks may feature a resistive heating element or liquid heating channels that may be used to raise the temperature of the chuck in preparation for, or during, semiconductor wafer processing. Similarly, some chucks may feature, or additionally feature, liquid cooling channels for removing heat from the chuck (and thus from a semiconductor wafer supported thereby). More generically, chucks may include one or more heat exchanger passages that may be used to heat and/or cool the chuck, depending on the circumstances, by flowing heated or cooled liquids

SUMMARY

Details of one or more implementations of the subject matter described in this specification are set forth in the accompanying drawings and the description below. Other features, aspects, and advantages will become apparent from the description, the drawings, and the claims.

The present inventors conceived of a new type of temperature-controlled chuck in which the chuck not only includes one or more heat exchange passages, but also includes one or more thermal tuning cavity features. The thermal tuning cavity features may generally correspond to locations in the material of the chuck where there are discontinuities in the chuck material that generally serve no other purpose except to passively modify heat flow within the chuck. For example, a chuck may be machined out of aluminum and may have one or more heat exchange passages that follow one or more paths within the interior of the chuck, as well as a plurality of holes features in the chuck that may be provided to accommodate other components, such as lift pins that may extend through holes in the chuck to contact the underside of a semiconductor wafer and lift the semiconductor wafer off of the chuck's wafer support surface. Such features, i.e., the hole features and the one or more heat exchange passages, represent discontinuities in the chuck material. However, these particular discontinuities exist for reasons other than to passively modify heat flow within the chuck. The hole features, for example, allow the lift pins to travel therethrough in order to contact the underside of the semiconductor wafer and potentially lift it clear of the chuck wafer support surface. The one or more heat exchange passages, in contrast, do modify heat flow, but do so in an active manner, e.g., by serving as a conduit for coolant or heating fluid to be actively flowed through the chuck. Thus, neither type of feature would be considered a thermal tuning cavity feature in the context of this disclosure.

The present inventors realized that chucks, even when carefully designed to try and minimize the effects of the various discontinuities in the chuck material, still caused noticeable azimuthal non-uniformity in the temperature of such chucks which, in turn, caused semiconductor wafers supported thereby to exhibit noticeable non-uniformities in wafer thickness. The present inventors further realized that by deliberately introducing additional discontinuities, such as the thermal tuning cavity features discussed herein, in the material of the chuck, it was possible to further tune the temperature uniformity of the chuck such that exceedingly uniform temperature gradients could be achieved and maintained during wafer processing operations. This, in turn would improve wafer processing uniformity in a similar manner.

Generally speaking, the techniques of the present disclosure may be practiced by starting with an existing chuck design that may include various features, such as one or more heat exchange passages and/or hole features for lift pins, temperature probes, high-voltage electrical connections for radio frequency power supply, electrical connections for a heater or heaters in the chuck, wafer presence sensors, etc., that are arranged so as to cause the wafer support surface of the chuck (the upper surface of the chuck on which a semiconductor wafer is placed during wafer processing operations) to exhibit a first temperature distribution when heated to a first temperature, e.g., via a heater embedded within the chuck. The first temperature distribution may then be analyzed to identify regions in which the temperature is lower than some reference temperature, e.g., lower than the average temperature of the first temperature distribution or a portion thereof. Once such regions have been identified, one or more thermal tuning cavity features may be added to the chuck within those regions. Such thermal tuning cavity features may act to remove a heat flow path that might have previously permitted an undesirably large amount of heat transfer to occur. For example, regions of the wafer support surface that are below the reference temperature may exhibit such cooler temperatures because the chuck structure in that region provides a more efficient heat flow path than in other regions of the chuck—this allows heat from those regions to flow more quickly from the wafer support surface to, for example, the one or more heat exchange passages of the chuck. By introducing one or more thermal tuning cavity features in those regions, the heat transfer efficiency thereof may be reduced, thereby causing the rate at which heat is drained from those regions to decrease and, in turn, causing the temperature within those regions to increase. Generally speaking, the larger the cross-sectional surface area of each thermal tuning cavity feature is in a plane parallel to the wafer support surface and/or the deeper each thermal tuning cavity feature is in a direction perpendicular to the wafer support surface, the more pronounced the temperature increase effect will be that such a thermal tuning cavity feature produces.

The use of such thermal tuning cavity features may allow for a chuck to be provided that provides exceptional temperature uniformity across the wafer support area. For example, various different chuck designs featuring heat exchange passages, heaters, and various hole features, but no thermal tuning cavity features, exhibited three standard deviations of between ~1.1° C. and ~0.45° C. (and ranges of ~1.45° C. to 0.65° C.) at a temperature in the 50° C. to 70° C. range when subjected to a heat load in the 2.5 kW to 3.5 kW range while coolant at approximately room temperature was supplied to the heat exchange passages within the chucks. In contrast, a similar chuck design that additionally featured several thermal tuning cavity features was exhibited a range of ~0.15° C. with three standard deviations of ~0.1° C. Thus, the temperature uniformity across the wafer support surface, i.e., a 300 mm diameter area, exhibited a maximum variation of 0.15 degrees between the highest and lowest temperature locations on the wafer support surfaces. This is exceedingly small; such highly uniform temperature fields were typically only able to be achieved in chucks that featured complex heating and temperature control systems, e.g., such as multi-zone heating systems in which multiple, discrete heaters may be controlled so as to variably deliver heat to different regions of the wafer support surface. While such systems may, in some cases, allow for temperature control at the die level, they are often complex and thus expensive. They may also be more susceptible to failure due to their increased complexity.

In contrast, chucks such as those described herein are relatively uncomplex and provide for passive management of heating uniformity (as opposed to active control of different heating elements in different zones to achieve heating uniformity) while also providing exceptionally uniform temperature distributions across the wafer support surfaces thereof. At the very least, this disclosure relates to at least the following implementations.

In some implementations, a wafer chuck may be provided may include a baseplate (in some implementations, including this one and others listed below, simply the baseplate for a wafer chuck may be provided), one or more heat exchange passages located within the baseplate, and one or more thermal tuning cavity features located within the baseplate. Each thermal tuning cavity feature may be positioned adjacent to a portion or adjacent portions of the one or more heat exchange passages, each thermal tuning cavity feature may correspond with a void space within the baseplate, and the one or more thermal tuning cavity features may be fluidically isolated from the heat exchange passages within the baseplate.

In some implementations, the one or more thermal tuning cavity features are empty of liquids when the wafer chuck is in normal use.

In some implementations, at least one of the one or more thermal tuning cavity features may be sealed and may have a vacuum environment within it.

In some such implementations, the vacuum environment may have a pressure less than or equal to 1 torr.

In some implementations at least one of the one or more thermal tuning cavity features may be sealed and filled with a gas.

In some implementations of the apparatus, the baseplate may have one or more hole features that extend into or through the baseplate, may be fluidically isolated from the one or more heat exchange passages within the baseplate, and may be configured to have a portion of a component located therewithin during normal use of the wafer chuck in a semiconductor processing chamber. In some implementations, the one or more thermal tuning cavity features may include at least a first thermal tuning cavity feature and a second thermal tuning cavity feature, the first thermal tuning cavity feature and the second thermal tuning cavity feature may be substantially symmetrically positioned on either side of a radial axis that extends from a center point of the baseplate through a center axis of a first hole feature of the one or more hole features and such that at least a portion of the one or more heat exchange passages may lie between the first hole feature and both the first thermal tuning cavity feature and the second thermal tuning cavity feature, and the center axis of the baseplate may pass through a location that corresponds with a nominal center point of a circular semiconductor wafer that the wafer chuck is configured to support.

In some implementations, the baseplate may have two or more hole features that extend into or through the baseplate, may be fluidically isolated from the one or more heat exchange passages within the baseplate, and may be configured to have a portion of a component located therewithin during normal use of the wafer chuck in a semiconductor processing chamber. The two or more hole features may include a first hole feature and a second hole feature, the first hole feature and the second hole feature may both be located between a first portion of the one or more heat exchange passages and a second portion of the one or more heat exchange passages, and the one or more thermal tuning cavity features may include at least a first thermal tuning cavity feature that is interposed between the first portion and the second portion as well as between the first hole feature and the second hole feature.

In some implementations, at least one of the one or more thermal tuning cavity features may be a slot with a uniform cross-sectional width in a region between a first end of the slot and a second, opposing end of the slot.

In some implementations, at least one of the one or more thermal tuning cavity features may be a slot with a non-uniform cross-sectional width in a region between a first end of the slot and a second, opposing end of the slot.

In some implementations, there may be a plurality of thermal tuning cavity features and the thermal tuning cavity features may be distributed non-uniformly throughout the baseplate.

In some implementations, each location of a thermal tuning cavity feature may, if (a) the corresponding thermal tuning cavity feature were instead replaced with the same material of the baseplate that adjoins the corresponding thermal tuning cavity feature and (b) the baseplate were heated to a temperature used in normal processing operations using the wafer chuck, correspond with a region of below-average temperature on a wafer support surface of the wafer chuck with respect to the average temperature of the wafer support surface of the wafer chuck.

In some implementations, the wafer chuck may further include a top plate that is positioned on a top surface of the wafer chuck.

In some such implementations, the top plate may include one or more heater elements. In some implementations, the top plate may be made, at least in part, of a ceramic material.

In some implementations, at least one of the one or more thermal tuning cavity features may be fully enclosed within the baseplate.

In some implementations, at least one of the one or more thermal tuning cavity features may be a recess that extends into the baseplate from a first side of the baseplate and does not extend through the baseplate to a side of the baseplate opposite the first side.

In some implementations, at least one of the one or more thermal tuning cavity features may extend completely through the baseplate.

Further details of the above-described concepts are discussed in more detail below with reference to the Figures, although it will be understood that the present disclosure is not limited to only the specific embodiments discussed herein, but also extends to other variants that will be apparent to those of ordinary skill in the art in the context of this disclosure.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

As discussed earlier, semiconductor chucks with very low temperature non-uniformity at a given process condition may be provided through the use of thermal tuning cavity features in particular areas. Before discussing implementations with thermal tuning cavity features, a preliminary discussion of common semiconductor wafer chuck features is provided below with respect to FIGS. 1 and 2.

Figures 1, 2:
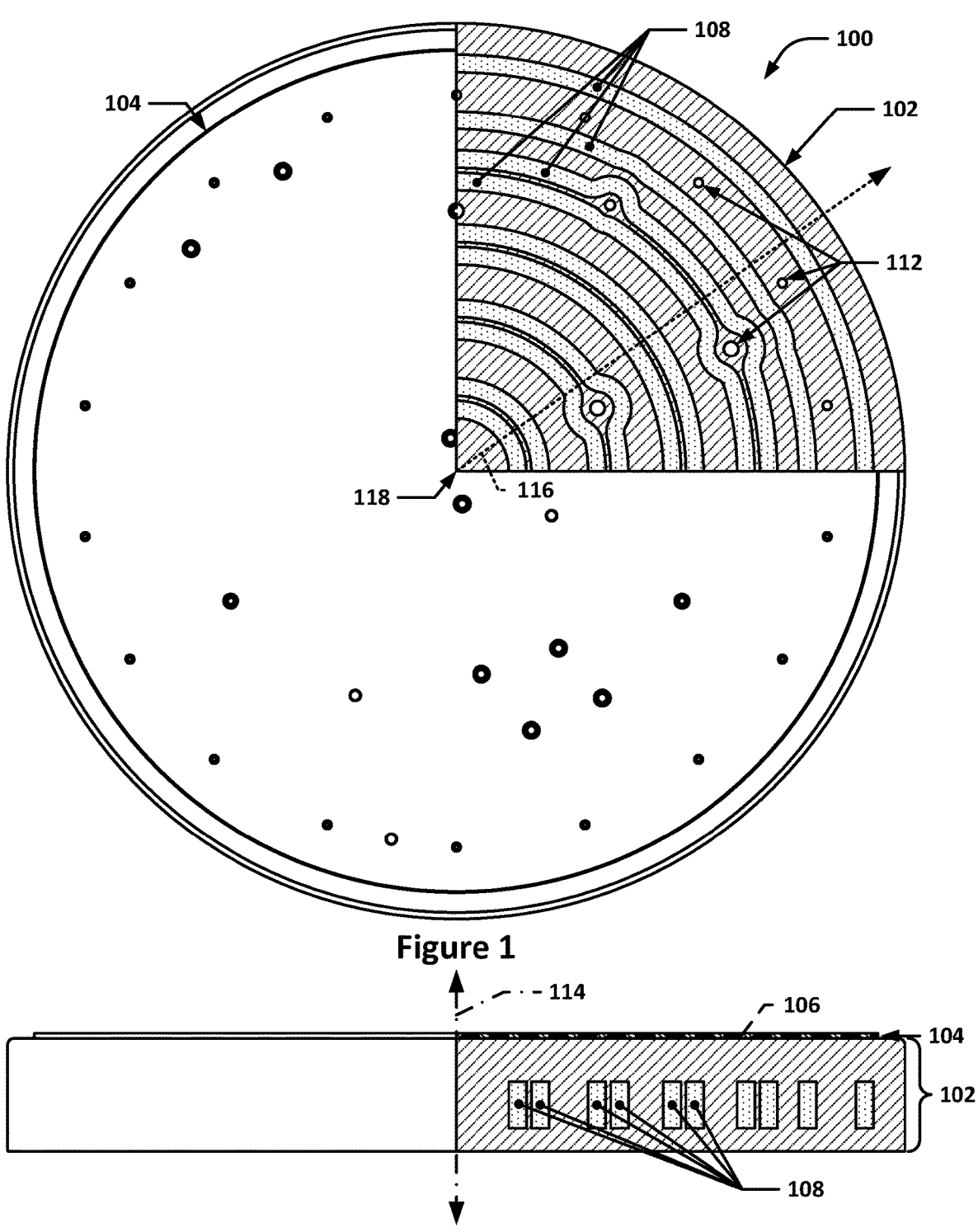
FIG. 1 shows a plan view of an example wafer chuck with a 90° segment thereof partially cut away to show heat exchanger passage features and various hole features in the wafer chuck.
FIG. 2 shows a side partial section view of the example wafer chuck of FIG. 1.

FIG. 1 shows a plan view of an example semiconductor wafer chuck with a 90° segment thereof partially cut away to show heat exchanger passage features and various hole features in the semiconductor wafer chuck. FIG. 2 shows a side partial section view of the example wafer chuck of FIG. 1 taken along radial axis 116.

The wafer chuck 100 of FIGS. 1 and 2 may include a baseplate 102, which may house one or more internal heat exchange passages 108 that may be configured to circulate a heat exchange medium, e.g., a liquid coolant such as Galden™ or Fluorinert™, within the baseplate 102, thereby allowing heat to be conducted away from the baseplate 102 (alternatively, heated heat exchange medium may be circulated within the one or more heat exchange passages 108 to provide for heating of the wafer chuck 100—for example, prior to processing a wafer, it may be desirable to heat the wafer chuck 100 from room temperature to an elevated temperature without requiring heat that results from wafer processing operations; in such cases, the wafer chuck 100 may be pre-heated by flowing heated heat exchange medium through the heat exchange passages 108). The baseplate 102 may, for example, be made of aluminum, ceramics, or other material that is suitable for supporting a semiconductor wafer during processing; for example, the baseplate 102 may be made of a material that is non-reactive (or nearly non-reactive) with the environment maintained within the processing chamber. In some implementations, a top plate 104 may be placed atop the baseplate 102 and serve to provide a wafer support surface that contacts and supports a semiconductor wafer placed upon the wafer chuck 100. The top plate 104 may, for example, be made from a ceramic or other dielectric material and may, in some implementations, have embedded within it one or more heater elements 106. For example, the top plate 104 may have a resistive heater trace in it that follows a serpentine or meandering path throughout a circular region within the top plate 104. Such a heater element 106 may alternatively be located in or on the baseplate 102, e.g., such as on the top surface of the baseplate 102 between the baseplate 102 and the top plate 104.

In some implementations, there may be no top plate 104 at all, and the baseplate 102 may itself provide the wafer support surface, i.e., semiconductor wafers may be placed directly on top of the baseplate 102 in preparation for wafer processing operations.

The baseplate 102 (and, in some cases, the top plate 104) may optionally have one or more hole features 112 that may be provided to allow for various components to extend into or through the baseplate 102. For example the hole features 112 may be included to allow for lift pins to be pushed through the wafer chuck 100 to lift a semiconductor wafer off of the wafer support surface thereof, one or more temperature probes to be inserted into the baseplate 102 to monitor internal temperatures thereof, electrical connections to be made, e.g., to a radio frequency electrode or electrodes and/or to the heater element(s) 106, to flow gas into the region between the semiconductor wafer and the top plate 104 or baseplate 102, and so forth. The hole features 112, as discussed earlier, are occupied by one or more components (lift pins, fasteners, electrical connectors, temperature probes, etc.) that provide functionality other than passive modification of heat flow through the baseplate 102 during normal use of the wafer chuck in semiconductor processing operations or are used to provide functionality not directly related to heat transfer, e.g., to flow an inert barrier gas (such as argon) into the region beneath a semiconductor wafer to shield the underside of the semiconductor wafer from process gases.

The hole features 112 are generally fluidically isolated from the heat exchange passage(s) 108, i.e., not part of the heat exchange passage(s). For clarity, "normal use" of the wafer chuck (or components thereof) refers to the typical use of the wafer chuck (or components thereof) during typical semiconductor processing operations, e.g., supporting a semiconductor wafer during processing operations and having a heat exchange fluid flowed through the heat exchange passages thereof For general reference in later discussion, the wafer chuck 100 may have a nominal center point 118 that may coincide with the intended center point of a semiconductor wafer that is placed on the wafer chuck 100 in a position intended for semiconductor processing operations; the wafer chuck 100 may also have a center axis 114 that passes through that center point 118 and is normal to the wafer support surface of the wafer chuck 100. Various side section views in this disclosure, such as the side section view shown in FIG. 2, may be shown using sections that are taken along a radial axis, such as radial axis 116, which extends radially outward from the center point 118/center axis 114.

It will be understood that the wafer chuck 100 of FIGS. 1 and 2 has generally fixed thermal properties—while the amount of heat that can be added to it and removed from it via the heater element(s) 106 and the heat exchange passages 108, as well as from the processing environment within the semiconductor chamber in which it is used, can be adjusted to some extent, there is little that can be done through modification of such inputs to affect the temperature uniformity across the wafer support surface of the wafer chuck 100. While the various features within the baseplate 102 discussed above with respect to FIGS. 1 and 2 may be engineered to reduce the temperature non-uniformity to the extent possible, e.g., by trying to make the passages or portions of the heat exchange passage(s) generally concentric, in most cases, there will generally always be some temperature non-uniformity that develops in the wafer support surface due to the internal geometry of the wafer chuck 100, as demonstrated in FIG. 7.

Figures 3, 4:
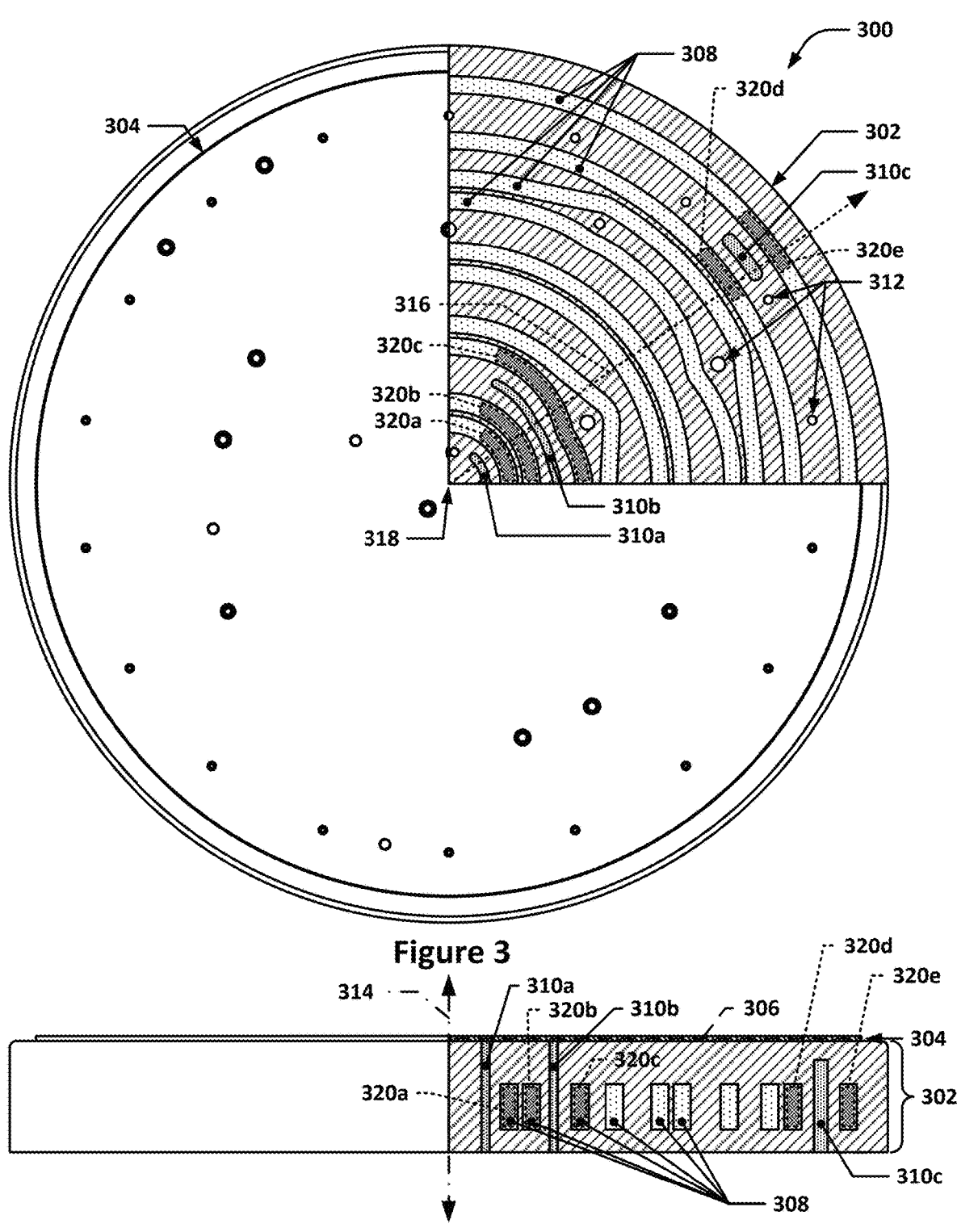
FIG. 3 shows a plan view of a further example wafer chuck with a 90° segment thereof partially cut away to show heat exchanger passage features, various hole features, and thermal tuning cavity features in the wafer chuck.
FIG. 4 shows a side partial section view of the example wafer chuck of FIG. 3.
Figures 5, 6:
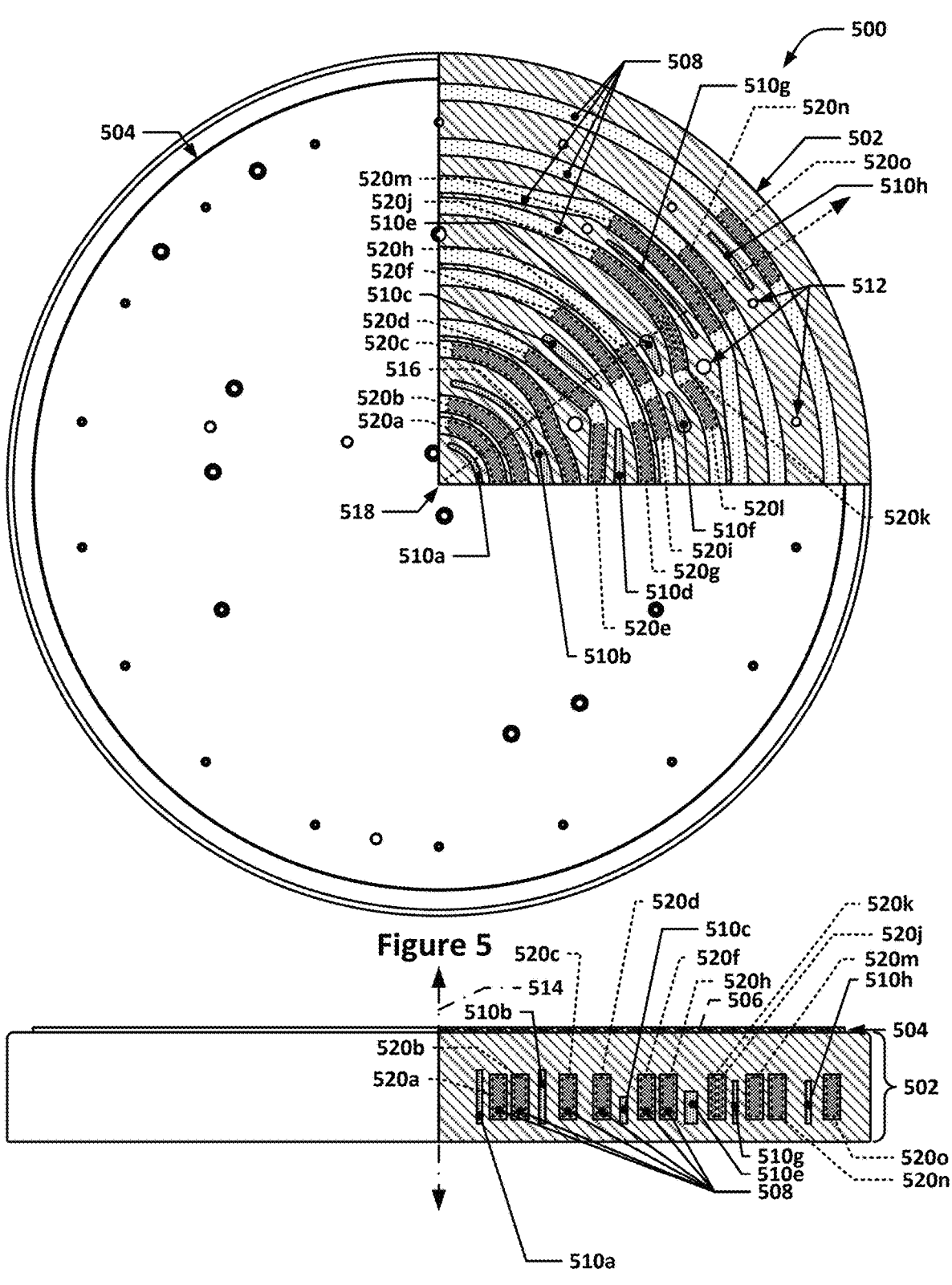
FIG. 5 shows a plan view of another example wafer chuck with a 90° segment thereof partially cut away to show heat exchanger passage features, various hole features, and thermal tuning cavity features in the wafer chuck.
FIG. 6 shows a side partial section view of the example wafer chuck of FIG. 5.
Figure 7:
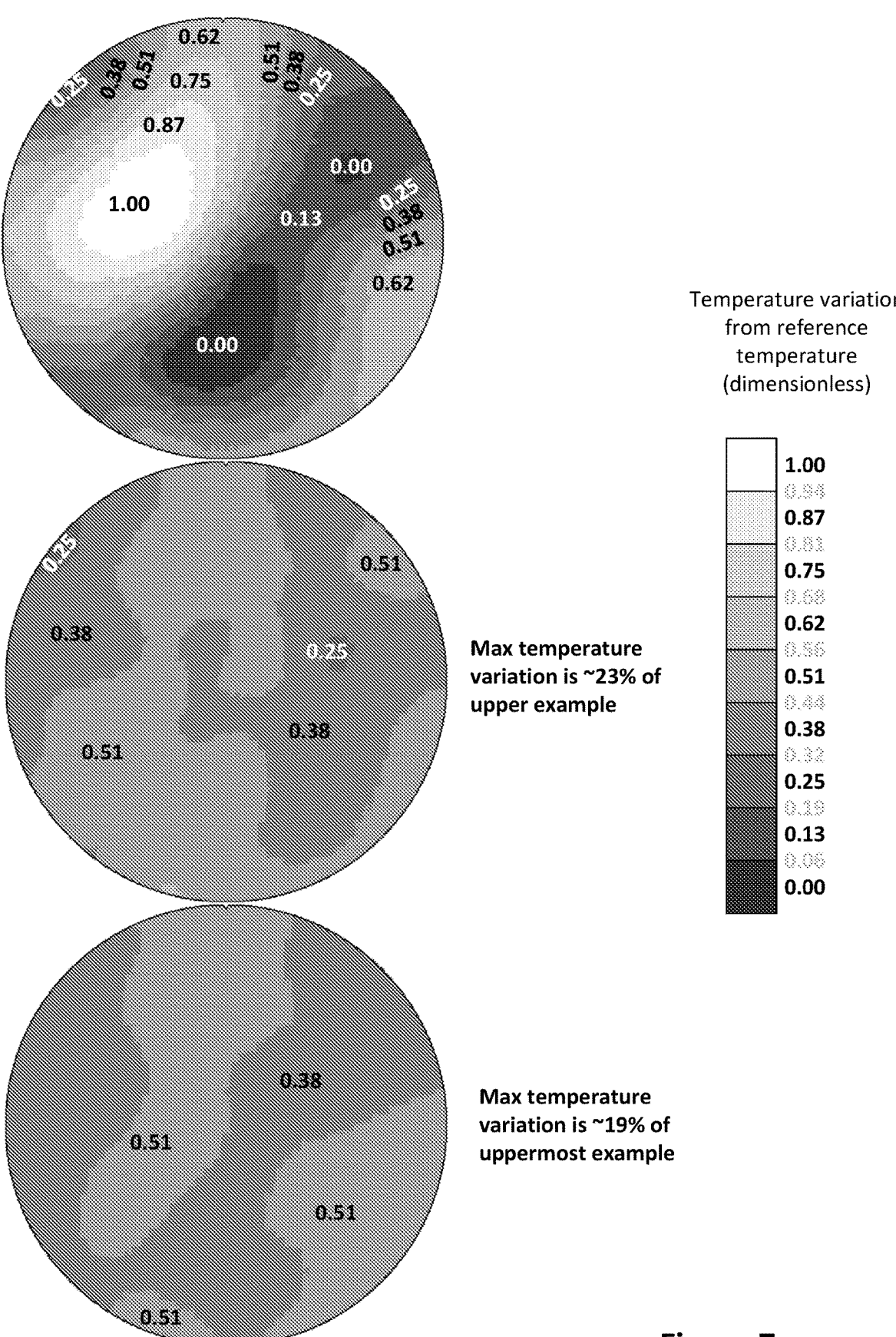
FIG. 7 shows normalized temperature variations from a reference temperature for the three wafer chucks of FIGS. 1, 3, and 5.

While the wafer chucks of FIGS. 3 and 5 have not yet been discussed, FIG. 7 shows normalized temperature variations from a reference temperature for the three wafer chucks of FIGS. 1, 3, and 5 for similar processing conditions, e.g., a heat load of between 2.5 kW to 3.2 kW to the wafer and wafer chuck, heat exchange passage(s) having heat exchange fluid flowed into them at ~20° C., and the wafer, wafer chuck, and chamber temperature kept at a nominal 60° C. In FIG. 7, "heat" maps of temperatures of the wafer support surfaces (shown as circular areas) of the corresponding wafer chucks 100, 300, and 500 are shown. The uppermost circular area represents the wafer support surface of the wafer chuck 100 of FIGS. 1 and 2.

To facilitate ease of comparison between the various wafer chucks represented in FIG. 7, the temperatures indicated in FIG. 7 have been normalized based on the temperature range that developed in the wafer chuck 100 of FIGS. 1 and 2. While there is no temperature scale shown in FIG. 7, the temperature range depicted may be understood to be on the order of 0.5° C. to 5.0° C. As can be seen, there are definite "hot" and "cold" spots at various locations across the wafer support surface (although it will be understood that these hot and cold spots may only vary in temperature by less than a degree Celsius).

As discussed above, a more uniform temperature profile for a wafer chuck may be obtained through placing thermal tuning cavity features at various locations within the baseplate of a wafer chuck.

FIG. 3 shows a plan view of a further example wafer chuck with a 90° segment thereof partially cut away to show heat exchanger passage features, various hole features, and thermal tuning cavity features in the wafer chuck. FIG. 4 shows a side partial section view of the example wafer chuck of FIG. 3.

In FIGS. 3 and 4, a wafer chuck 300 is shown that includes a baseplate 302, a top plate 304, a heater element 306, a plurality of hole features 312, and one or more heat exchange passages 308. Like the wafer chuck 100, the wafer chuck 300 may also have a center point 318, a center axis 314, and one or more radial axes, such as radial axis 316. The partial section view of the wafer chuck 300 in FIG. 4 is taken along the radial axis 316. With respect to the above features, the wafer chuck 300 is largely similar to the wafer chuck 100, although it will be noted that the two wafer chucks do have different placements of hole features and a different arrangement of heat exchange passages 308. The wafer chuck 300, however, is distinctly different from the wafer chuck 100 in that there are thermal tuning cavity features 310 that are located at various positions within the baseplate 302. The thermal tuning cavity features 310, while indicated with a shaded fill pattern, are to be understood to be empty space (or filled with gas). It will be understood that additional thermal tuning cavity features 310 may be located in other portions of the baseplate 302 that are not visible in FIG. 3, and that the specific locations of each thermal tuning cavity feature may be unique to any given wafer chuck 300 design.

In the depicted example, there are three thermal tuning cavity features 310 (310a, 310b, and 310c) visible in FIGS. 3 and 4; the radial axis 316 has been selected such that it passes through all three such thermal tuning cavity features 310, and cross-sections of those thermal tuning cavity features 310 are visible in FIG. 4. Each thermal tuning cavity feature may be generally adjacent to a portion 320 or adjacent portions 320 of the one or more heat exchange passages 308 when viewed along an axis perpendicular to the wafer support surface of the wafer chuck. For example, the thermal tuning cavity feature 310a is adjacent to portion 320a, the thermal tuning cavity feature 310b is adjacent to portions 320b and 320c, and the thermal tuning cavity feature 310c is adjacent to portions 320d and 320e.

As can be seen, the thermal tuning cavity features 310 may be of different widths, depths, and/or distances from the wafer support surface of the wafer chuck 300. In FIG. 3, the thermal tuning cavity features 310 depicted are milled channels that are of constant width along the paths that each thermal tuning cavity feature 310 follows (except at the endcaps of each such thermal tuning cavity feature 310, which are both rounded and thus decrease in cross-sectional area as one moves past the center points of either rounded endcap and towards the outermost point of either endcap). The thermal tuning cavity features 310, as can be seen, may have different cross-sectional widths from thermal tuning cavity feature 310 to thermal tuning cavity feature 310—for example, the two thermal tuning cavity features 310 that are closest to the center point 318 have cross-sectional widths, when viewed along the center axis 314, that are both nearly slightly more than half the cross-sectional width of the third thermal tuning cavity feature 310 visible near the outside of the baseplate 302 from the same perspective. Conversely, the two thermal tuning cavity features 310 that are closest to the center point 318 are slots that extend, in this example, all the way through the baseplate 302 (and may, as shown, be "open" on the underside of the baseplate 302; alternatively, another component may be placed adjacent to the underside of the baseplate 302 to cover such openings—similarly to how the top plate 304 closes off the openings formed in the baseplate 302's top surface that are present because of the thermal tuning cavity features 310), whereas the third thermal tuning cavity feature 310 located near the outer perimeter of the baseplate 302 is a blind slot that extends only partially into the baseplate 302 from the bottom of the baseplate 302. Generally speaking, configuring thermal tuning cavity features such that they have larger cross-sectional areas in a plane parallel to the wafer support surface, deeper depths, and/or are closer to the wafer support surface may generally have the effect of causing the temperature in the regions where those thermal tuning cavity features are located to increase to a greater extent than configuring thermal tuning cavity features such that they have smaller cross-sectional areas in a plane parallel to the wafer support surface, shallower depths, and/or are farther from the wafer support surface. In most cases, by adding a thermal tuning cavity feature in a region where there is a "cold" or "cool" spot (a local decrease in temperature compared with the surrounding temperature of the baseplate 302), the flow of heat from that region may be disrupted or hindered such that heat is not able to flow out of that region as quickly. This leads to increased heat retention in such a region and, as a result, a higher temperature. By varying the size and/or depth of such thermal tuning cavity features, greater or lesser amounts of temperature adjustment may be realized; it will be recognized that the process for establishing the locations, number, size, and/or depth of such thermal tuning cavity features may be somewhat iterative and may differ from wafer chuck design to wafer chuck design depending on the configuration, for example, of the heat exchange passage(s), hole features, and other aspects of the wafer chuck.

In the case of the wafer chuck 300 of FIGS. 3 and 4, the thermal tuning cavity features 310a and 310b both extend completely through the baseplate 302 (terminating, in this case, at the top plate 304), while the thermal tuning cavity feature 310c terminates at a location within the baseplate 302 offset from the top plate 304.

The wafer chuck 300 of FIGS. 3 and 4, due to the presence of the thermal tuning cavity features (both those depicted and other thermal tuning cavity features not visible in FIGS. 3 and 4) exhibits markedly improved temperature uniformity than the wafer chuck 100 of FIGS. 1 and 2 (which had no thermal tuning cavity features). For example, the heat map of the middle circular area of FIG. 7 depicts the temperature distribution for such a wafer chuck 300 under similar boundary conditions as for that governing the upper heat map plot of FIG. 7. As can be seen, there is much less temperature variation across the wafer support surface of the wafer chuck 300 than the wafer chuck 100, e.g., the maximum temperature variation in the wafer chuck 300 is approximately 23% of that observed in the wafer chuck 100, i.e., a 76% reduction in temperature variation across the wafer support surface of the wafer chuck 300 compared with the wafer chuck 100.

FIG. 5 shows a plan view of another example wafer chuck with a 90° segment thereof partially cut away to show heat exchange passage features, various hole features, and thermal tuning cavity features in the wafer chuck. FIG. 6 shows a side partial section view of the example wafer chuck of FIG. 5 taken along radial axis 516. The wafer chuck 500, as with the wafer chucks 100 and 300 discussed earlier, includes a baseplate 502, a top plate 504, a heater element 506, a plurality of hole features 512, and one or more heat exchange passages 508. Like the wafer chucks 100 and 300, the wafer chuck 500 may also have a center point 518, a center axis 514, and one or more radial axes, such as radial axis 516. The partial section view of the wafer chuck 500 in FIG. 6 is taken along the radial axis 516.

As is evident, the baseplate 502 of the wafer chuck 500 includes a plurality of thermal tuning cavity features 510, e.g., thermal tuning cavity features 510a through 510h. In contrast to the thermal tuning cavity features 310 of wafer chuck 300, some of the thermal tuning cavity features 510 that are depicted feature variable cross-sectional widths along their lengths. For example, the thermal tuning cavity feature 510b has two portions—a first portion at a first cross-sectional width and a second portion at a second cross-sectional width (which is about twice as wide as the first cross-sectional width). The transition between the two cross-sectional widths is, in this example, essentially a step-change (for example, caused by milling the first portion with an end mill of a diameter equal to the first cross-sectional width and milling the second portion with an end mill of a diameter equal to the second cross-sectional width). However, other thermal tuning cavity features may have varying cross-sectional widths that vary in a gradual or continuous manner, e.g., as may be machined by making repeated passes along various milling paths using an end mill of a diameter smaller than the larger cross-sectional dimension of the thermal tuning cavity feature. For example, the thermal tuning cavity feature pairs 510c/510d and 510e/510f each include two thermal tuning cavity features that are generally mirrored about a radial axis; these thermal tuning cavity features have gradually varying cross-sectional widths and, as seen in FIG. 5, have an airfoil-shaped appearance.

In some implementations, two (or more) thermal tuning cavity features 310 that are positioned in a generally symmetrical manner on opposite sides of a radial axis may be used to offset a temperature imbalance that may be caused by a discontinuity in a portion of a heat exchange passage 508, e.g., as may be caused by the presence of a hole feature 512. For example, the portions 520d and 520e of the heat exchange passage 508 are on either side of a discontinuity, e.g., a relatively sharp bend or "knee," in the heat exchange passage 508 which arises due to a change in routing of the heat exchange passage 508 due to the presence of a hole feature 512 located adjacent to, and radially inwards from, the discontinuity.

Such a discontinuity may cause the heat exchange passage 508 in the discontinuity area to be closer to a neighboring portion of the heat exchange passage 508 in between portions 520f and 520g, which may, in turn, normally cause there to be increased cooling by the heat exchange passage 508 in that local area. By including thermal tuning cavity features 510c and 510d, however, the amount of cooling that occurs in that region may be reduced and the temperature at the wafer support surface may be increased to be closer to that of the surrounding area.

A similar arrangement is evident in the thermal tuning cavity features 510e and 510f. In both cases, the thermal tuning cavity features 510c/510d and 510e/510f may be positioned in a substantially symmetrical arrangement about a radial axis that extends from the center point 518 of the baseplate 502 through, for example, the center of the discontinuity or the center of the hole feature that causes the discontinuity.

Another type of thermal tuning cavity feature 510 that is evident in FIG. 5 are thermal tuning cavity features 510 that extend between two hole features 512 and are located between two adjacent portions 520 of the one or more heat exchange passages 508. For example, thermal tuning cavity features 510g and 510h are both located between two adjacent portions 520 of the one or more heat exchange passages 508 and between two hole features 512.

As can be seen in FIG. 6, the thermal tuning cavity features 510 are all located entirely within the baseplate 502, in contrast to the thermal tuning cavity features 310 of FIG. 3. Such thermal tuning cavity features 510 may be produced by manufacturing the baseplate 502 as multiple layers, with the thermal tuning cavity features 510 machined in one or more surfaces of those layers, and then bonding those layers together to form the baseplate 502.

The performance of the wafer chuck 500 is visible in FIG. 7, where it can be seen that the temperature variation of the wafer chuck 500 is much less than that of the wafer chuck 100—approximately 19% of the temperature variation experienced in the wafer chuck 100.

In many implementations, the thermal tuning cavity features in a given baseplate for a wafer chuck may be distributed throughout the baseplate in a non-uniform manner. In an ideal case, a wafer chuck would have completely axisymmetric temperature control to allow the temperature of the wafer support surface to be kept completely uniform. However, due to various real-world limitations, e.g., the inclusion of hole features, the inclusion of serpentine heat exchange passages, the inclusion of electrical connectors, etc., it is actually quite difficult to achieve completely axisymmetric temperature control. The use of thermal tuning cavity features in wafer chucks provides one mechanism by which temperature non-uniformities that arise due to the inclusion of such features may be mitigated or largely or completely eliminated.

Wafer chucks such as those described herein may offer superior temperature control for semiconductor processing operations without requiring costly or complex temperature control systems. While such wafer chucks may have a somewhat limited temperature range in which such temperature control is able to be achieved (the thermal tuning cavity features may have more or less effectiveness depending on the temperature of the baseplate), such wafer chucks may, at the operating temperatures at which they are designed to operate, provide superior and stable temperature uniformity across their wafer support surfaces.

It will also be understood that the thermal tuning cavity features discussed herein may, in some instances, be filled with gas or be evacuated to at least a partial vacuum, e.g., less than or equal to 1 torr in pressure, in order to adjust the behavior of the thermal tuning cavity features. For example, in some implementations, a thermal tuning cavity feature may be constructed so as to have nothing inside of it except for a small amount of gas, e.g., the thermal tuning cavity feature may have a vacuum environment therein—such an implementation may cause the thermal tuning cavity feature to have increased resistance to heat flow, as there may be no material (or very little material in the form of whatever gas may be present in the vacuum) within the thermal tuning cavity feature to support conductive or convective heat transfer.

Figures 8, 9:
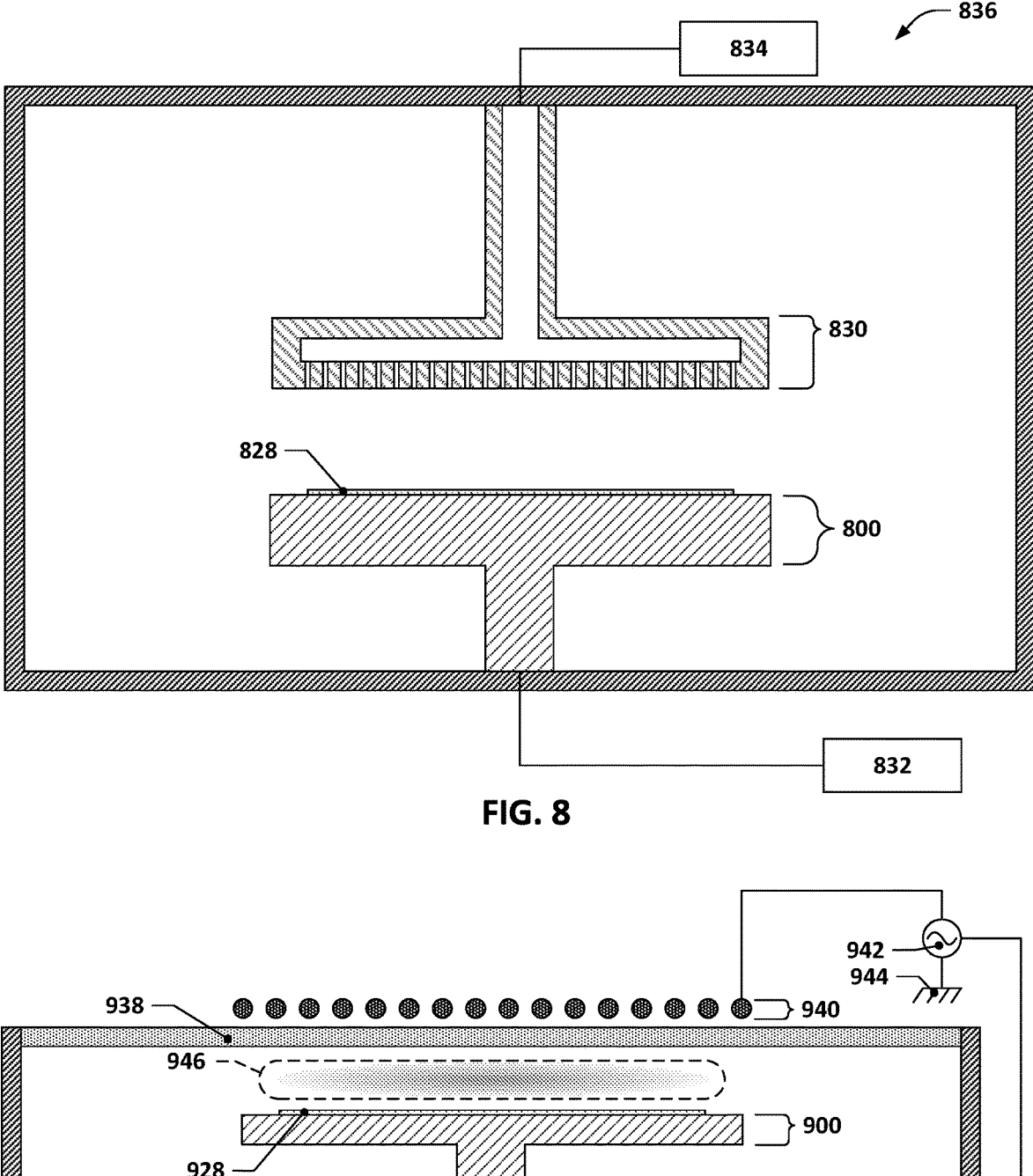
FIG. 8 shows a schematic of a semiconductor processing chamber.
FIG. 9 shows a schematic of another semiconductor processing chamber.

FIG. 8 shows a schematic of a semiconductor processing chamber in which the wafer chucks discussed above may be used. In FIG. 8, a chamber 836 is depicted which houses within it one or more semiconductor wafer processing stations (only one is shown, but additional stations may be provided as well). Each semiconductor wafer station may include a showerhead 830 or other gas distribution system and a wafer chuck 800, which may be a temperature-controlled wafer chuck with thermal tuning cavity features as discussed above.

The wafer chuck 800 may support a semiconductor wafer 828 on its upper surface or wafer support surface. A controller 832 may be provided to control various aspects of the apparatus, including, for example, controlling the amount of power delivered to a heater of the wafer chuck 800, the flow of coolant though one or more heat exchange passages of the wafer chuck 800, and the flow of gases through the showerhead, e.g., from gas source 834. The semiconductor processing chamber of FIG. 8 may, for example, be used for a deposition process.

FIG. 9 shows a schematic of another semiconductor processing chamber in which the wafer chucks discussed above may also be used. In FIG. 9, a chamber 936 is depicted which houses within it, as with the chamber 836 of FIG. 8, a wafer chuck 900 such as one of the wafer chucks discussed herein. The wafer chuck 900 may be used to support a wafer 928, which may be subjected to a plasma 946 that may be generated by supplying power to one or both of radio-frequency (RF) generators 942 (the plasma may be formed from a gas that may be introduced into the region above the wafer 928, e.g., via a gas supply (not pictured). The RF generators 942 may be controlled by a controller 932; one of the RF generators 942 may be coupled to an electrode (not shown) in the wafer chuck 900 and the other RF generator 942 may be coupled to a coil 940 that may be positioned above a dielectric plate 938 that may serve as the ceiling of the chamber 936, thereby allowing the RF power emanated by the coil 940 to pass into the chamber 936. The chamber 936 may, for example, be used for an etch process.

The controllers discussed above may be part of a system that may include the above-described examples, and may be operatively connected with various valves, mass flow controllers, pumps, etc. so as to be able to receive information from and/or control such equipment. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of various gases, temperature settings (e.g., heating and/or cooling), pressure settings, vacuum settings, power settings, flow rate settings, fluid delivery settings, and positional and operation settings.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet. Similarly, "fluidically isolated" is used with respect to two volumes, e.g., two volumes within a structure, that are separated from each other such that fluid cannot flow from one volume to the other, e.g., such that fluid cannot flow from one volume to another within that structure.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure. For the avoidance of any doubt, it is also to be understood that the above disclosure is at least directed to the following numbered implementations, as well as to other implementations that are evident from the above disclosure.

Implementation 1: A wafer chuck, the wafer chuck including a baseplate, one or more heat exchange passages located within the baseplate, and one or more thermal tuning cavity features located within the baseplate, in which: each thermal tuning cavity feature is positioned adjacent to a portion or adjacent portions of the one or more heat exchange passages, each thermal tuning cavity feature corresponds with a void space within the baseplate, and the one or more thermal tuning cavity features are fluidically isolated from the heat exchange passages within the baseplate.

Implementation 2: The wafer chuck of implementation 1, in which the one or more thermal tuning cavity features are empty of liquids when the wafer chuck is in normal use.

Implementation 3: The wafer chuck of implementation 1, in which at least one of the one or more thermal tuning cavity features is sealed and has a vacuum environment within it.

Implementation 4: The wafer chuck of implementation 3, in which the vacuum environment has a pressure less than or equal to 1 torr.

Implementation 5: The wafer chuck of implementation 1, in which at least one of the one or more thermal tuning cavity features is sealed and filled with a gas.

Implementation 6: The wafer chuck of implementation 1, in which: the baseplate has one or more hole features that extend into or through the baseplate, are fluidically isolated from the one or more heat exchange passages within the baseplate, and are configured to have a portion of a component located therewithin during normal use of the wafer chuck in a semiconductor processing chamber, the one or more thermal tuning cavity features includes at least a first thermal tuning cavity feature and a second thermal tuning cavity feature, the first thermal tuning cavity feature and the second thermal tuning cavity feature are substantially symmetrically positioned on either side of a radial axis that extends from a center point of the baseplate through a center axis of a first hole feature of the one or more hole features and such that at least a portion of the one or more heat exchange passages lies between the first hole feature and both the first thermal tuning cavity feature and the second thermal tuning cavity feature, and the center axis of the baseplate passes through a location that corresponds with a nominal center point of a circular semiconductor wafer that the wafer chuck is configured to support.

Implementation 7: The wafer chuck of implementation 1, in which: the baseplate has two or more hole features that extend into or through the baseplate, are fluidically isolated from the one or more heat exchange passages within the baseplate, and are configured to have a portion of a component located therewithin during normal use of the wafer chuck in a semiconductor processing chamber, the two or more hole features include a first hole feature and a second hole feature, the first hole feature and the second hole feature are both located between a first portion of the one or more heat exchange passages and a second portion of the one or more heat exchange passages, and the one or more thermal tuning cavity features includes at least a first thermal tuning cavity feature that is interposed between the first portion and the second portion as well as between the first hole feature and the second hole feature.

Implementation 8: The wafer chuck of implementation 1, in which at least one of the one or more thermal tuning cavity features is a slot with a uniform cross-sectional width in a region between a first end of the slot and a second, opposing end of the slot.

Implementation 9: The wafer chuck of implementation 1, in which at least one of the one or more thermal tuning cavity features is a slot with a non-uniform cross-sectional width in a region between a first end of the slot and a second, opposing end of the slot.

Implementation 10: The wafer chuck of implementation 1, in which there are a plurality of thermal tuning cavity features and the thermal tuning cavity features are distributed non-uniformly throughout the baseplate.

Implementation 11: The wafer chuck of implementation 1, in which each location of a thermal tuning cavity feature would, if (a) the corresponding thermal tuning cavity feature were instead replaced with the same material of the baseplate that adjoins the corresponding thermal tuning cavity feature and (b) the baseplate were heated to a temperature used in normal processing operations using the wafer chuck, correspond with a region of below-average temperature on a wafer support surface of the wafer chuck with respect to the average temperature of the wafer support surface of the wafer chuck.

Implementation 12: The wafer chuck of implementation 1, further including a top plate, in which the top plate is positioned on a top surface of the wafer chuck.

Implementation 13: The wafer chuck of implementation 12, in which the top plate includes one or more heater elements.

Implementation 14: The wafer chuck of implementation 12, in which the top plate is made, at least in part, of a ceramic material.

Implementation 15: The wafer chuck of implementation 1, in which at least one of the one or more thermal tuning cavity features is fully enclosed within the baseplate.

Implementation 16: The wafer chuck of implementation 1, in which at least one of the one or more thermal tuning cavity features is a recess that extends into the baseplate from a first side of the baseplate and does not extend through the baseplate to a side of the baseplate opposite the first side.

Implementation 17: The wafer chuck of implementation 1, in which at least one of the one or more thermal tuning cavity features extends completely through the baseplate.

18: A baseplate for a wafer chuck, the baseplate including one or more heat exchange passages located within the baseplate and one or more thermal tuning cavity features located within the baseplate, in which: each thermal tuning cavity feature is positioned adjacent to a portion or adjacent portions of the one or more heat exchange passages, each thermal tuning cavity feature corresponds with a void space within the baseplate, and the one or more thermal tuning cavity features are fluidically isolated from the heat exchange passages within the baseplate.

Implementation 19: The baseplate of implementation 18, in which the one or more thermal tuning cavity features are empty of liquids when the baseplate is in normal use.

Implementation 20: The baseplate of implementation 18, in which at least one of the one or more thermal tuning cavity features is sealed and has a vacuum environment within it.

Implementation 21: The baseplate of implementation 20, in which the vacuum environment has a pressure less than or equal to 1 torr.

Implementation 22: The baseplate of implementation 18, in which at least one of the one or more thermal tuning cavity features is sealed and filled with a gas.

Implementation 23: The baseplate of implementation 18, in which the baseplate has one or more hole features that extend into or through the baseplate, are fluidically isolated from the one or more heat exchange passages within the baseplate, and are configured to have a portion of a component located therewithin during normal use of the baseplate in a semiconductor processing chamber, the one or more thermal tuning cavity features includes at least a first thermal tuning cavity feature and a second thermal tuning cavity feature, the first thermal tuning cavity feature and the second thermal tuning cavity feature are substantially symmetrically positioned on either side of a radial axis that extends from a center point of the baseplate through a center axis of a first hole feature of the one or more hole features and such that at least a portion of the one or more heat exchange passages lies between the first hole feature and both the first thermal tuning cavity feature and the second thermal tuning cavity feature, and the center axis of the baseplate passes through a location that corresponds with a nominal center point of a circular semiconductor wafer that the baseplate is configured to support.

Implementation 24: The baseplate of implementation 18, in which the baseplate has two or more hole features that extend into or through the baseplate, are fluidically isolated from the one or more heat exchange passages within the baseplate, and are configured to have a portion of a component located therewithin during normal use of the baseplate in a semiconductor processing chamber, the two or more hole features include a first hole feature and a second hole feature, the first hole feature and the second hole feature are both located between a first portion of the one or more heat exchange passages and a second portion of the one or more heat exchange passages, and the one or more thermal tuning cavity features includes at least a first thermal tuning cavity feature that is interposed between the first portion and the second portion as well as between the first hole feature and the second hole feature.

Implementation 25: The baseplate of implementation 18, in which at least one of the one or more thermal tuning cavity features is a slot with a uniform cross-sectional width in a region between a first end of the slot and a second, opposing end of the slot.

Implementation 26: The baseplate of implementation 18, in which at least one of the one or more thermal tuning cavity features is a slot with a non-uniform cross-sectional width in a region between a first end of the slot and a second, opposing end of the slot.

Implementation 27: The baseplate of implementation 18, in which there are a plurality of thermal tuning cavity features and the thermal tuning cavity features are distributed non-uniformly throughout the baseplate.

Implementation 28: The baseplate of implementation 18, in which each location of a thermal tuning cavity feature would, if (a) the corresponding thermal tuning cavity feature were instead replaced with the same material of the baseplate that adjoins the corresponding thermal tuning cavity feature and (b) the baseplate were heated to a temperature used in normal processing operations using the baseplate, correspond with a region of below-average temperature on a wafer support surface of the baseplate with respect to the average temperature of the wafer support surface of the baseplate.

Implementation 29: The baseplate of implementation 18, in which at least one of the one or more thermal tuning cavity features is fully enclosed within the baseplate.

Implementation 30: The baseplate of implementation 18, in which at least one of the one or more thermal tuning cavity features is a recess that extends into the baseplate from a first side of the baseplate and does not extend through the baseplate to a side of the baseplate opposite the first side.

Implementation 31: The baseplate of implementation 18, in which at least one of the one or more thermal tuning cavity features extends completely through the baseplate.

What is claimed is:

1. An apparatus comprising:
a baseplate for a wafer chuck, the baseplate including:

a heat exchange passage located within the baseplate, and one or more thermal tuning cavity features located within the baseplate, wherein:

each thermal tuning cavity feature is positioned adjacent to a portion or portions of the heat exchange passage, each thermal tuning cavity feature corresponds with a void space within the baseplate, the one or more thermal tuning cavity features are fluidically isolated from the heat exchange passage within the baseplate, and at least one of the one or more thermal tuning cavity features is positioned adjacent to, and radially interposed between, different portions of the heat exchange passage that are radially adjacent to one another.

2. The apparatus of claim 1, wherein the one or more thermal tuning cavity features are empty of liquids when the baseplate is in normal use.

3. The apparatus of claim 1, wherein at least one of the one or more thermal tuning cavity features is sealed and has a vacuum environment within it.

4. The apparatus of claim 3, wherein the vacuum environment has a pressure less than or equal to 1 torr.

5. The apparatus of claim 1, wherein at least one of the one or more thermal tuning cavity features is sealed and filled with a gas.

6. The apparatus of claim 1, wherein:
the baseplate has one or more hole features that extend into or through the baseplate, are fluidically isolated from the heat exchange passage within the baseplate, and are configured to have a portion of a component located therewithin during normal use of the baseplate in a semiconductor processing chamber,
the one or more thermal tuning cavity features includes at least a first thermal tuning cavity feature and a second thermal tuning cavity feature,
the first thermal tuning cavity feature and the second thermal tuning cavity feature are substantially symmetrically positioned on either side of a radial axis that extends from a center point of the baseplate through a center axis of a first hole feature of the one or more hole features and such that at least a portion of the heat exchange passage lies between the first hole feature and both the first thermal tuning cavity feature and the second thermal tuning cavity feature, and
the center axis of the baseplate passes through a location that corresponds with a nominal center point of a circular semiconductor wafer that the baseplate is configured to support.

7. The apparatus of claim 1, wherein:
the baseplate has two or more hole features that extend into or through the baseplate, are fluidically isolated from the heat exchange passage within the baseplate, and are configured to have a portion of a component located therewithin during normal use of the baseplate in a semiconductor processing chamber,
the two or more hole features include a first hole feature and a second hole feature,
the first hole feature and the second hole feature are both located between a first portion of the heat exchange passage and a second portion of the heat exchange passage, and
the one or more thermal tuning cavity features includes at least a first thermal tuning cavity feature that is interposed between the first portion and the second portion as well as between the first hole feature and the second hole feature.

8. The apparatus of claim 1, wherein at least one of the one or more thermal tuning cavity features is a slot with a uniform cross-sectional width in a region between a first end of the slot and a second, opposing end of the slot.

9. The apparatus of claim 1, wherein at least one of the one or more thermal tuning cavity features is a slot with a non-uniform cross-sectional width in a region between a first end of the slot and a second, opposing end of the slot.

10. The apparatus of claim 1, wherein there are a plurality of thermal tuning cavity features and the thermal tuning cavity features are distributed non-uniformly throughout the baseplate.

11. The apparatus of claim 1, wherein each location of a thermal tuning cavity feature would, if (a) the corresponding thermal tuning cavity feature were instead replaced with the same material of the baseplate that adjoins the corresponding thermal tuning cavity feature and (b) the baseplate were heated to a temperature used in normal processing operations using the baseplate, correspond with a region of below-average temperature on a wafer support surface of the baseplate with respect to the average temperature of the wafer support surface of the baseplate.

12. The apparatus of claim 1, wherein at least one of the one or more thermal tuning cavity features is fully enclosed within the baseplate.

13. The apparatus of claim 1, wherein at least one of the one or more thermal tuning cavity features is a recess that extends into the baseplate from a first side of the baseplate and does not extend through the baseplate to a side of the baseplate opposite the first side.

14. The apparatus of claim 1, wherein at least one of the one or more thermal tuning cavity features extends completely through the baseplate.

15. The apparatus of any one of claims 1 through 14, further comprising a wafer chuck that includes the baseplate.

16. The apparatus of claim 15, wherein the one or more thermal tuning cavity features are empty of liquids when the wafer chuck is in normal use.

17. The apparatus of claim 16, wherein:

the baseplate has one or more hole features that extend into or through the baseplate, are fluidically isolated from the heat exchange passage within the baseplate, and are configured to have a portion of a component located therewithin during normal use of the wafer chuck in a semiconductor processing chamber, the one or more thermal tuning cavity features includes at least a first thermal tuning cavity feature and a second thermal tuning cavity feature, the first thermal tuning cavity feature and the second thermal tuning cavity feature are substantially symmetrically positioned on either side of a radial axis that extends from a center point of the baseplate through a center axis of a first hole feature of the one or more hole features and such that at least a portion of the heat exchange passage lies between the first hole feature and both the first thermal tuning cavity feature and the second thermal tuning cavity feature, and the center axis of the baseplate passes through a location that corresponds with a nominal center point of a circular semiconductor wafer that the wafer chuck is configured to support.

18. The apparatus of claim 16, wherein:

the baseplate has two or more hole features that extend into or through the baseplate, are fluidically isolated from the heat exchange passage within the baseplate, and are configured to have a portion of a component located therewithin during normal use of the wafer chuck in a semiconductor processing chamber, the two or more hole features include a first hole feature and a second hole feature, the first hole feature and the second hole feature are both located between a first portion of the heat exchange passage and a second portion of the heat exchange passage, and the one or more thermal tuning cavity features includes at least a first thermal tuning cavity feature that is interposed between the first portion and the second portion as well as between the first hole feature and the second hole feature.

19. The apparatus of claim 16, wherein each location of a thermal tuning cavity feature would, if (a) the corresponding thermal tuning cavity feature were instead replaced with the same material of the baseplate that adjoins the corresponding thermal tuning cavity feature and (b) the baseplate were heated to a temperature used in normal processing operations using the wafer chuck, correspond with a region of below-average temperature on a wafer support surface of the wafer chuck with respect to the average temperature of the wafer support surface of the wafer chuck.

20. The apparatus of claim 16, further including a top plate, wherein the top plate is positioned on a top surface of the wafer chuck.

21. The apparatus of claim 20, wherein the top plate includes one or more heater elements.

22. The apparatus of claim 21, wherein the top plate is made, at least in part, of a ceramic material.

* * * * *